(12) United States Patent
Cho et al.

(10) Patent No.: US 11,710,448 B2
(45) Date of Patent: Jul. 25, 2023

(54) LIGHT EMITTING ELEMENT AND DISPLAY DEVICE INCLUDING THE SAME

(71) Applicant: SAMSUNG ELECTRONICS CO., LTD., Suwon-si (KR)

(72) Inventors: Oul Cho, Hwaseong-si (KR); Tae Hyung Kim, Seoul (KR); Ilyoung Lee, Yongin-si (KR); Eun Joo Jang, Suwon-si (KR); Won Sik Yoon, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/578,173

(22) Filed: Jan. 18, 2022

(65) Prior Publication Data

US 2022/0230581 A1 Jul. 21, 2022

(51) Int. Cl.
*G09G 3/32* (2016.01)
*H10K 50/115* (2023.01)

(52) U.S. Cl.
CPC ....... *G09G 3/32* (2013.01); *G09G 2300/0842* (2013.01); *G09G 2300/0861* (2013.01); *G09G 2310/08* (2013.01); *G09G 2320/043* (2013.01); *H10K 50/115* (2023.02)

(58) Field of Classification Search
None
See application file for complete search history.

(56) References Cited

U.S. PATENT DOCUMENTS

| | | | |
|---|---|---|---|
| 7,453,755 B2 | 11/2008 | Cleeves | |
| 7,595,775 B2 | 9/2009 | Osame et al. | |
| 8,289,244 B2 | 10/2012 | Hasumi et al. | |
| 8,325,259 B2 | 12/2012 | Kobayashi et al. | |
| 8,497,885 B2 | 7/2013 | Ikeda et al. | |
| 9,318,540 B2 | 4/2016 | Qing et al. | |
| 9,761,173 B2 | 9/2017 | Han | |
| 10,145,736 B2 | 12/2018 | Ahmed et al. | |
| 10,198,995 B1 | 2/2019 | Chen | |
| 10,217,412 B2 | 2/2019 | Hwang et al. | |
| 10,460,691 B2 | 10/2019 | Hwang et al. | |
| 10,657,888 B2 | 5/2020 | Gao et al. | |
| 2009/0015524 A1* | 1/2009 | Koyama | G09G 3/30 345/77 |

(Continued)

FOREIGN PATENT DOCUMENTS

| | | |
|---|---|---|
| CN | 108932928 | 12/2018 |
| CN | 109064968 | 12/2018 |

(Continued)

OTHER PUBLICATIONS

Chen et al., "Active Matrix Driving", Handbook of Visual Display Technology, Springer-Verlag Berlin Heidelberg, (2012), pp. 1-20.

(Continued)

*Primary Examiner* — Christopher J Kohlman
(74) *Attorney, Agent, or Firm* — Cantor Colburn LLP

(57) ABSTRACT

A light emitting element includes a first electrode, a second electrode, and a light emission layer interposed between the first electrode and the second electrode, where an emission efficiency of the light emission layer varies based on a voltage applied to at least one selected from the first electrode and the second electrode.

19 Claims, 11 Drawing Sheets

(56) References Cited

U.S. PATENT DOCUMENTS

| | | | |
|---|---|---|---|
| 2015/0287927 A1* | 10/2015 | Okubo | ............... H01L 51/0085 |
| | | | 257/40 |
| 2020/0090587 A1 | 3/2020 | Seo et al. | |
| 2020/0152119 A1 | 5/2020 | Xuan | |

FOREIGN PATENT DOCUMENTS

| | | |
|---|---|---|
| CN | 111554819 | 8/2020 |
| EP | 1094436 | 4/2001 |
| KR | 100647000 B1 | 11/2006 |
| KR | 101226172 B1 | 1/2013 |

OTHER PUBLICATIONS

European Search Report—European Patent Application No. 21196939.9 dated Mar. 14, 2022.

Dechun Zou et al., "Improvement of current-Voltage Characteristics in Organic Light Emitting Diodes by Application of Reversed-Bias Voltage," Japanese Journal of Applied Physics, 1998, pp. L1406-L1408, vol. 37.

E. Jang et al., "White-Light-Emitting Diodes with Quantum Dot Color Converters for Display Backlights," Adv. Mater. 2010, pp. 3076-3080, vol. 22.

H. Shen et al., "Visible quantum dot light-emitting diodes with simultaneous high brightness and efficiency," Nature Photonics, 2019, pp. 192-197, vol. 13.

Hyungsuk Moon et al., "Stability of Quantum Dots, Quantum Dot Films, and Quantum Dot Light-Emitting Diodes for Display Applications," Advanced Materials, 2019, 14 pages, vol. 31, 1804294.

K. Blankenbach, "Active Matrix Driving" in Chen et al. "Handbook of Visual Display Technology," 2012, Springer-Verlag Berlin Heidelberg.

Seth Coe et al., "Electroluminescence from single monolayers of nanocrystals in molecular organic devices," Nature, 2002, pp. 800-803, vol. 420, Nature Publishing Group.

Tae-Ho Kim et al., "Full-colour quantum dot displays fabricated by transfer printing," Nature Photon. 2011, pp. 176-182, vol. 5, Macmillan Publishers Limited.

X. Hou et al., "Engineering Auger recombination in colloidal quantum dots via dielectric screening," Nature Communications, 2019, 11 pages.

Yeonghun Lee et al., "Gate Capacitance Modeling and Diameter-Dependent Performance of Nanowire MOSFETs," IEEE Transactions on Electron Devices, Apr. 2012, pp. 1037-1045, vol. 59, No. 4.

Yichun Luo et al., "Correlation between electroluminescence efficiency and stability in organic light-emitting devices under pulsed driving conditions," Journal of Applied Physics, 2006, 4 pages, vol. 99, 054508.

Young-Shin Park et al., "Auger Recombination of Biexcitons and Negative and Positive Trions in Individual Quantum Dots," ACS Nano, 2014, pp. 7288-7296, vol. 8, No. 7.

* cited by examiner

LIGHT EMITTING ELEMENT AND DISPLAY DEVICE INCLUDING THE SAME

CROSS-REFERENCE TO RELATED APPLICATION

This application claims priority to Korean Patent Application No. 10-2021-0006642, filed on Jan. 18, 2021, and all the benefits accruing therefrom under 35 U.S.C. § 119, the content of which in its entirety is herein incorporated by reference.

BACKGROUND

(a) Field

The disclosure relates to a light emitting element and a display device including the light emitting element.

(b) Description of the Related Art

A quantum dot is a nanocrystal of a semiconductor material with a diameter of about 10 nanometers (nm) or less, and is a material that has a quantum confinement effect. The quantum dot typically generates light that is stronger than a normal phosphor in a narrow wavelength band. Light emission of the quantum dots is generated when excited electrons transition from a conduction band to a valence band, and the quantum dots have characteristics that a wavelength varies depending on a particle size even in a case in which the quantum dots are formed of the same material. As a size of the quantum dot becomes smaller, the quantum dot emits light with a shorter wavelength, and thus by controlling the size thereof, light in a desired wavelength region may be obtained.

That is, an emission layer including quantum dots, and various light emitting elements including the emission layer, generally have a lower manufacturing cost compared with an organic light emitting element including an emission layer including phosphorescent and/or fluorescent materials, and may emit a desired color by varying the size of the quantum dots without using other organic materials in the emission layer to emit light of different colors.

SUMMARY

Luminous efficiency of an emission layer including a quantum dot is determined by quantum efficiency of the quantum dot, charge carrier balance, light extraction efficiency, and leakage current. Accordingly, methods such as controlling excitons to be confined to the emission layer, controlling holes and electrons to be smoothly transported to quantum dots, and preventing the leakage current are desired to improve the luminous efficiency of the emission layer.

The disclosure provides a light emitting element and a display device including the light emitting element that may improve element efficiency and degradation (life-span reduction) due to a charging phenomenon of a charge carrier.

An embodiment provides a light emitting element including a first electrode, a second electrode, and a light emission layer interposed between the first electrode and the second electrode, where an emission efficiency of the light emission layer varies based on a voltage applied to at least one selected from the first electrode and the second electrode.

In an embodiment, a voltage applied to the first electrode in an emission period, during which the light emission layer emits light, may be higher than a voltage applied to the second electrode in the emission period.

In an embodiment, a voltage applied to the second electrode in a non-emission period, during which the light emission layer does not emit light, may be higher than a voltage applied to the first electrode in the non-emission period.

In an embodiment, an emission period during which the light emission layer emits light, in one frame may be longer than a non-emission period, during which the light emission layer does not emit light, in the one frame.

In an embodiment, the emission efficiency of the light emission layer may increase during the non-emission period, during which the light emission diode does not emit light.

In an embodiment, the light emission layer may include a quantum dot layer.

In an embodiment, the quantum dot layer may include a quantum dot phosphor material or a phosphorescent material.

In an embodiment, the quantum dot layer may be provided in plural.

Another embodiment provides a display device including: a plurality of pixels, where each of the plurality of pixels includes a light emission diode, a first transistor connected between an anode of the light emission diode and a first power source voltage line, a second transistor which transmits a data signal in response to a first scan signal, a capacitor connected to a gate of the first transistor, where the capacitor stores a voltage corresponding to the data signal, a third transistor connected between one end of the first transistor and a cathode of the light emission diode, a fourth transistor connected between the anode of the light emission diode and a second power source voltage line, and a fifth transistor which complementarily operates with the fourth transistor and is connected between the cathode of the light emission diode and the second power source voltage line, and an emission efficiency of the light emission diode varies based on a voltage applied to at least one selected from the anode and the cathode.

In an embodiment, the fifth transistor may be turned on in an emission period, during which the light emission diode emits light, and the third transistor and the fourth transistor may be turned off in the emission period.

In an embodiment, the fifth transistor may be turned off in a non-emission period, during which the light emission diode does not emit light, and the third transistor and the fourth transistor may be turned on in the non-emission period.

In an embodiment, a voltage applied to the anode during the emission period may be higher than a voltage applied to the cathode during the emission period.

In an embodiment, a voltage applied to the cathode during the non-emission period may be higher than a voltage applied to the anode during the non-emission period.

In an embodiment, the emission period in one frame may be longer than the non-emission period in the one frame.

In an embodiment, an emission efficiency of a light emission layer of the light emission diode interposed between the anode and the cathode may increase in the non-emission period.

In an embodiment, the light emission layer may include a quantum dot (layer.

In an embodiment, the quantum dot layer may include a quantum dot phosphor material or a phosphorescent material.

In an embodiment, the capacitor may include one electrode connected to the gate of the first transistor and another electrode connected to the first power source voltage line.

In an embodiment, each of the plurality of pixels may further include a sixth transistor which is turned on during an emission period, during which the light emission diode emits light, and is connected between one end of the first transistor and the first power source voltage line, and a seventh transistor which is turned on by the first scan signal and is connected between one end and the gate of the first transistor.

In an embodiment, a level of the data signal may be changed at least once during a non-emission period, during which the light emission diode does not emit light.

Another embodiment provides a light emitting element including a first electrode, a second electrode, and a light emission layer interposed between the first electrode and the second electrode, where a forward voltage is applied to the light emission diode during an emission period, during which the light emission layer emits light, and a reverse voltage is applied to the light emission diode during a non-emission period, during which the light emission layer does not emit light.

According to embodiments, interface charging of an emission layer including a quantum dot and an electron transporting layer is eliminated, thereby reducing degradation of a light emitting element and increasing a life-span thereof.

In such embodiments, display quality of a display device may be improved.

DETAILED DESCRIPTION

Figure 1:
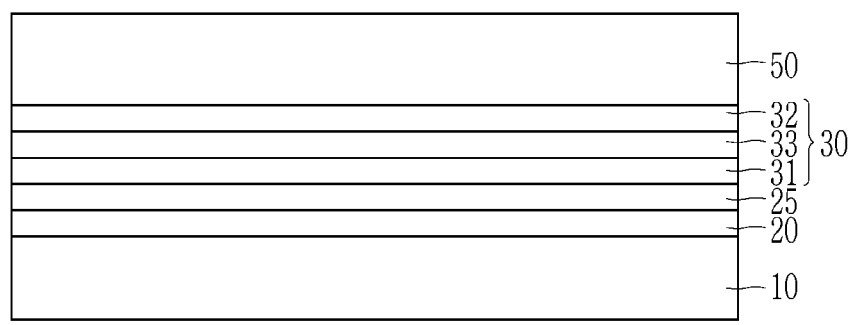
FIG. 1 illustrates a schematic cross-sectional view of a light emitting element of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 illustrates a schematic cross-sectional view of a light emitting element of a display device according to an embodiment.

In an embodiment, as shown in FIG. 1, a display device includes a first substrate 10, an active array layer 20, a quantum dot diode 30, and a second substrate 50.

The display device may include a plurality of unit pixel groups for displaying full color, and the plurality of unit pixel groups may be alternately disposed along rows and/or columns. Each unit pixel group includes a plurality of pixels, and the pixels in each unit pixel group may have one of various arrangements, such as a matrix of 2×2 and a matrix of 3×3. Each unit pixel group may include, for example, a red pixel, a green pixel, and a blue pixel, and may further include, for example, a white pixel. Configuration and disposition of the unit pixel group may be variously changed or modified.

In an embodiment, the first substrate 10 may be a substrate including an insulating material. The first substrate 10 may be a glass substrate, a polymer substrate, or a semiconductor substrate. The polymer substrate may include, for example, various polymers such as a polyester (for example, polyethylene terephthalate ("PET"), polyethylene naphthalate ("PEN")), a polycarbonate, a polyacrylate, a polyimide, and a polyamideimide; inorganic materials such as a polysiloxane (for example, polydimethylsiloxane ("PDMS")), $Al_2O_3$, and ZnO; and a copolymer thereof, a derivative thereof, or a combination thereof, but is not limited thereto. In an embodiment where the first substrate 10 is a polymer substrate, a flexible display device may be effectively implemented. A thickness of the first substrate 10 may be appropriately selected in consideration of the substrate material and the like, and is not particularly limited.

The active array layer 20 may include a thin film transistor array including a plurality of thin film transistors. Each of the plurality of pixels may include at least one of the thin film transistors.

An insulating layer 25 is disposed on the active array layer 20. A plurality of contact holes is defined through the insulating layer 25 to expose some of the plurality of thin film transistors.

The quantum dot diode 30 is disposed on the insulating layer 25. The quantum dot diode 30 may include a first quantum dot diode for displaying a first color, a second quantum dot diode for displaying a second color, and a third quantum dot diode for displaying a third color. In an embodiment, each of the first color, the second color, and the third color may be one of three primary colors, but is not limited thereto, and all quantum dot diodes 30 included in the display device may display a same color as each other.

The quantum dot diode 30 includes a lower electrode 31 and an upper electrode 32 facing each other, and an emission layer 33 disposed between the lower electrode 31 and the upper electrode 32. The upper electrode 32 may be a common electrode commonly provided for all of the quantum dot diodes.

In an embodiment, one of the lower electrode 31 and the upper electrode 32 is an anode, and the other thereof is a cathode. In one embodiment, for example, the lower electrode 31 may be an anode, and the upper electrode 32 may be a cathode.

The anode may include or be made of a conductor having a high work function, for example, a metal, a conductive metal oxide, or a combination thereof. The anode may include or be made of, for example, a metal such as nickel, platinum, vanadium, chromium, copper, zinc, gold, or an alloy thereof; a conductive metal oxide such as a zinc oxide, an indium oxide, a tin oxide, indium tin oxide ("ITO"), indium zinc oxide ("IZO"), or a fluorine-doped tin oxide; or a combination of a metal and an oxide such as ZnO and Al or $SnO_2$ and Sb, but is not limited thereto.

The cathode may include or be made of a conductor with a lower work function than the anode, for example, a metal, a conductive metal oxide, and/or conductive polymer. The cathode may include or be made of, for example, a metal such as aluminum, magnesium, calcium, sodium, potassium, titanium, indium, yttrium, lithium, gadolinium, silver, tin, lead, cesium, barium, or an alloy thereof; or a multi-layered material such as LiF/Al, $LiO_2$/Al, Liq/Al, LiF/Ca, and $BaF_2$/Ca, but is not limited thereto.

At least one selected from the lower electrode 31 and the upper electrode 32 may be a transmissive electrode, and the transmissive electrode may include or be made of, for example, a conductive metal oxide such as a zinc oxide, an indium oxide, a tin oxide, TO, IZO, or a fluorine-doped tin oxide, or a thin single- or multi-layered metal thin film. In an embodiment where one of the lower electrode 31 and the upper electrode 32 is an opaque electrode, the one of the lower electrode 31 and the upper electrode 32 may include or be made of, for example, an opaque conductor such as aluminum (Al), silver (Ag), or gold (Au).

Thicknesses of the lower electrode 31 and the upper electrode 32 are not particularly limited, and may be appropriately selected in consideration of element efficiency. In one embodiment, for example, the thickness of the electrode may be 5 nanometers (nm) or more, for example, 50 nm or more. In one embodiment, for example, the thickness of the electrode may be 100 μm or less, for example, 10 μm or less, or 1 μm or less, 900 nm or less, 500 nm or less, or 100 nm or less.

The emission layer 33 includes at least one quantum dot. The quantum dot means a semiconductor nanocrystal in a broad sense, and for example, the quantum dot may have various shapes such as an isotropic semiconductor nanocrystal, a quantum rod, and a quantum plate. Here, the quantum rod may mean a quantum dot having an aspect ratio of 1 or more, for example, about 2 or more, about 3 or more, or about 5 or more. In one embodiment, for example, the aspect ratio of the quantum rod may be about 50 or less, about 30 or less, or about 20 or less.

The quantum dot may have a particle diameter (a size of a longest part when it is not spherical) of, for example, about 1 nm to about 100 nm, for example, about 1 nm to 80 nm, about 1 nm to 50 nm, or about 1 nm to 20 nm.

An energy band gap of the quantum dot may be adjusted according to a size and/or composition thereof, and accordingly, a light emitting wavelength may also be adjusted by controlling the size and/or composition of the quantum dot therein. In one embodiment, for example, as the size of quantum dot increases, the quantum dot may have a narrow energy band gap, and thus the quantum dot may emit light in a relatively long wavelength region, while as the size of the quantum dot decreases, the quantum dot may have a wide energy band gap, and thus the quantum dot may emit light in a relatively short wavelength region.

The quantum dot may emit, for example, light in a predetermined wavelength region of a visible light region according to its size and/or composition. In one embodiment, for example, the quantum dot may emit blue light, red light, or green light, and the blue light may have, for example, a peak emission wavelength in a wavelength range of about 430 nm to about 470 nm, the red light may have, for example, a peak emission wavelength in a wavelength range of about 600 nm to about 650 nm, and the green light may have, for example, a peak emission wavelength in a wavelength range of about 520 nm to about 550 nm.

The first quantum dot diode may include a quantum dot that emits light of the first color, the second quantum dot diode may include a quantum dot that emits light of the second color, and the third quantum dot diode may include a quantum dot that emits light of the third color. In one embodiment, for example, the first quantum dot may include a blue quantum dot that emits blue light, the second quantum dot may include a green quantum dot that emits green light, and the third quantum dot may include a red quantum dot that emits red light.

An average size of the blue quantum dot may be, for example, about 4.5 nm or less, for example, about 4.3 nm or less, about 4.2 nm or less, about 4.1 nm or less, or about 4.0 nm or less. An average size of the blue quantum dot may be in a range of, for example, about 2.0 nm to about 4.5 nm, about 2.0 nm to about 4.3 nm, about 2.0 nm to about 4.2 nm, about 2.0 about nm to about 4.1 nm, or about 2.0 nm to about 4.0 nm.

The quantum dot may have, for example, a quantum yield of about 10% or more, for example, about 30% or more, about 50% or more, about 60% or more, about 70% or more, or about 90% or more.

The quantum dot may have a relatively narrow full width at half maximum ("FWHM"). Herein, the FWHM is a width of a wavelength corresponding to a half of a peak emission point, and as the FWHM is narrower, light in a narrower wavelength region may be emitted and high color purity may be obtained. The quantum dot may have, for example, the FWHM of about 50 nm or less, and within this range, for example, about 49 nm or less, about 48 nm or less, about 47 nm or less, about 46 nm or less, about 45 nm or less, about 44 nm or less, about 43 nm or less, about 42 nm or less, about 41 nm or less, about 40 nm or less, about 39 nm or less, about 38 nm or less, about 37 nm or less, about 36 nm or less, about 35 nm or less, about 34 nm or less, about 33 nm or less, about 32 nm or less, about 31 nm or less, about 30 nm or less, about 29 nm or less, or about 28 nm or less.

The quantum dot may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be, for example, a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be, for example, a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be, for example, a binary element compound such as SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; and a quaternary element compound such as SnPbSSe, SnPbSeTe, SnPbSTe, or a combination thereof, but is not limited thereto. The Group IV semiconductor compound may be, for example, a singular element semiconductor compound such as Si, Ge, or a combination thereof; and a binary element semiconductor compound of SiC, SiGe, or a combination thereof, but is not limited thereto. The Group semiconductor compound may be, for example, $CuInSe_2$, $CuInS_2$, CuInGaSe, CuInGaS, or a combination thereof, but is not limited thereto. The Group I-II-IV-VI semiconductor compound may be, for example, CuZnSnSe, CuZnSnS, or a combination thereof, but is not limited thereto. The Group II-III-V semiconductor compound may be, for example, InZnP, but is not limited thereto.

The quantum dot may include the binary semiconductor compound, the ternary semiconductor compound, or the quaternary semiconductor compound in a substantially uniform concentration or partially different concentration distributions.

In one embodiment, for example, the quantum dot may include a Cd-free quantum dot. Cadmium (Cd) may cause severe environment/health problems, and cadmium (Cd) is a restricted element by Restriction of Hazardous Substances Directive ("RoHS") in many countries, thus the Cd-free quantum dot may be desired.

In one embodiment, for example, the quantum dot may be a semiconductor compound including zinc (Zn) and at least one selected from tellurium (Te) and selenium (Se). In one embodiment, for example, the quantum dot may be a Zn—Te semiconductor compound, a Zn—Se semiconductor compound, and/or a Zn—Te—Se semiconductor compound, and may be a blue quantum dot. In one embodiment, for example, an amount of tellurium (Te) in the Zn—Te—Se semiconductor compound may be smaller than that of selenium (Se). The semiconductor compound may emit blue light that has a peak emission wavelength in a wavelength region of less than or equal to about 470 nm, for example, in a wavelength region of about 430 nm to about 470 nm.

The quantum dot may be, for example, a semiconductor compound including at least one selected from indium (In), zinc (Zn), and phosphorus (P). In one embodiment, for example, the quantum dot may be an In—Zn semiconductor compound, an In—P semiconductor compound, and/or an In—Zn—P semiconductor compound, and may be a blue quantum dot. In one embodiment, for example, a mole ratio of zinc (Zn) to indium (In) in the In—Zn semiconductor compound or the In—Zn—P semiconductor compound may be larger than or equal to about 25. The semiconductor compound may emit blue light that has a peak emission wavelength in a wavelength region of less than or equal to about 470 nm, for example, in a wavelength region of about 430 nm to about 470 nm.

The quantum dot may have a core-shell structure in which one quantum dot surrounds another quantum dot. In one embodiment, for example, the core and the shell of the quantum dot may have an interface, and the interface may have a concentration gradient in which the concentration of the element(s) of the shell decreases toward the center thereof. In one embodiment, for example, a material composition of the shell of the quantum dot has a higher energy band gap than a material composition of the core of the quantum dot, and accordingly, the quantum dot may provide a quantum confinement effect.

The quantum dot may have a single quantum dot core and a multi-layered quantum dot shell surrounding the core. Herein, the multi-layered shell has at least two shells in which each shell may independently have a single composition, an alloy, and/or a concentration gradient. In one embodiment, for example, a shell of a multi-layered shell that is far from the core may have a higher energy band gap than a shell that is near to the core, and accordingly, the quantum dot may provide a quantum confinement effect.

The quantum dot having a core-shell structure may, for example, include a core including a first semiconductor compound including at least one selected from zinc (Zn), tellurium (Te), and selenium (Se), and a shell disposed on at least one portion of the core and including a second semiconductor compound having a different composition from that of the core.

The first semiconductor compound of Zn—Te—Se may be, for example, a Zn—Se-based semiconductor compound including a small amount of tellurium (Te), for example, a semiconductor compound represented by $ZnTe_xSe_{1-x}$ (where x is greater than about 0 and less than or equal to about 0.05).

In one embodiment, for example, in the Zn—Te—Se-based first semiconductor compound, the mole amount of zinc (Zn) may be larger than that of selenium (Se), and the mole amount of selenium (Se) may be larger than that of tellurium (Te). In one embodiment, for example, a mole ratio of tellurium (Te) to selenium (Se) in the first semiconductor compound may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01. In one embodiment, for example, a mole ratio of tellurium (Te) to zinc (Zn) in the first semiconductor compound may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01.

The second semiconductor compound may include, for example, a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. In such an embodiment, the Group II-VI semiconductor compound, the Group III-V semiconductor compound, the Group IV-VI semiconductor compound, the Group IV semiconductor compound, the Group semiconductor compound, the Group I-II-IV-VI semiconductor compound, and the Group II-III-V semiconductor compound are the same as those described above.

In one embodiment, for example, the second semiconductor compound may include zinc (Zn), selenium (Se), and/or sulfur (S). In one embodiment, for example, the shell may include at least one internal shell disposed near to the core and an outermost shell disposed at the outermost shell of the quantum dot, and the internal shell may include ZnSeS, while the outermost shell may include SnS. In one embodiment, for example, the shell may have a concentration gradient of one component, and for example, an amount of sulfur (S) may increase while moving away from the core.

The quantum dot having a core-shell structure may include, for example, a core including a third semiconductor compound including at least one selected from indium (In), zinc (Zn), and phosphorus (P), and a shell disposed on at least one a portion of the core and including a fourth semiconductor compound having a different composition from that of the core.

In an embodiment, a mole ratio of zinc (Zn) to indium (In) in the In—Zn—P-based third semiconductor compound may be larger than or equal to about 25. In one embodiment, for example, the mole ratio of zinc (Zn) to indium (In) in the In—Zn—P-based first semiconductor compound may be larger than or equal to about 28, larger than or equal to about 29, or larger than or equal to about 30. In one embodiment, for example, the mole ratio of zinc (Zn) to indium (In) in the In—Zn—P-based first semiconductor compound may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include, for example, a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor compound, the Group semiconductor compound, the Group I-II-IV-VI semiconductor compound, and the Group II-III-V semiconductor compound are the same as described above.

In one embodiment, for example, the fourth semiconductor compound may include zinc (Zn) and sulfur (S), and optionally selenium (Se). In one embodiment, for example, the shell may include at least one internal shell disposed near to the core and an outermost shell disposed at the outermost shell of the quantum dot, and at least one of the internal shell and the outermost shell may include the fourth semiconductor compound of ZnS or ZnSeS.

The emission layer 33 may have, for example, a thickness of about 5 nm to about 200 nm, for example, about 10 nm to about 150 nm, about 10 nm to about 100 nm, or about 10 nm to about 50 nm.

The quantum dot diode 30 may further include a charge auxiliary layer (not shown) between the lower electrode 31 and the emission layer 33 and/or between the upper electrode 32 and the emission layer 33. The charge auxiliary layer may be formed as or defined by a single layer or two or more layers, and may allow holes or electrons to be easily injected and/or transported from the lower electrode 31 to the emission layer 33 and/or from the upper electrode 32 to the emission layer 33. In one embodiment, for example, the charge auxiliary layer may include a hole injection layer, a hole transporting layer, an electron blocking layer, an electron injection layer, a charge transporting layer, and/or a hole blocking layer.

In one embodiment, for example, the charge auxiliary layer may include a hole transporting layer, and the hole transporting layer HTL may include, for example, at least one selected from poly(9,9-dioctyl-fluorene-co-N-(4-butylphenyl)-diphenylamine) ("TFB"), polyarylamine, poly(N-vinylcarbazole), poly(3,4-ethylenedioxythiophene) ("PEDOT"), poly(3,4-ethylenedioxythiophene) polystyrene sulfonate ("PEDOT:PSS"), polyaniline, polypyrrole, N,N,N',N'-tetrakis(4-methoxyphenyl)-benzidine ("TPD"), 4-bis[N-(1-naphthyl)-N-phenyl-amino]biphenyl ("α-NPD"), m-MTDATA (4,4',4"-Tris[phenyl(m-tolyl)amino]triphenylamine), 4,4',4"-tris(N-carbazolyl)-triphenylamine ("TCTA"), 1,1-bis[(di-4-tolylamino)phenyl cyclohexane ("TAPC"), a P-type metal oxide (e.g., NiO, $WO_3$, $MoO_3$, etc.), a carbon-based material such as graphene oxide, and a combination thereof, but is not limited thereto.

In an embodiment, the emission layer 33 may be separated for each pixel, that is, portions of the emission layer 33 corresponding to the pixels, respectively, may be separated or spaced apart from each other. In an alternative embodiment, the emission layer 33 may have a structure of a common layer commonly provided on the quantum dot diode 30. In such an embodiment, the emission layer 33 may have a structure in which a first emission layer for emitting light of a first color, a second emission layer for emitting light of a second color, and a third emission layer for emitting light of a third color are stacked one on another.

The second substrate 50 faces the first substrate 10, and for example, may be a glass substrate, a polymer substrate, or a semiconductor substrate. The polymer substrate may include, for example, polycarbonate, polymethyl methacrylate, polyethylene terephthalate, polyethylene naphthalate, a polyamide, polyethersulfone, a copolymer thereof, a derivative thereof, or a combination thereof, but is not limited thereto. In an embodiment, where the second substrate 50 is the polymer substrate, a flexible display device may be effectively implemented. The first substrate 10 and the second substrate 50 may be combined with each other by a sealing material (not shown).

Figure 2:
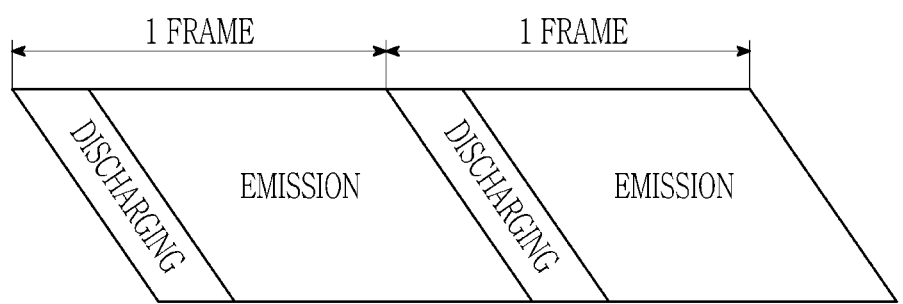
FIG. 2 illustrates an emission period and a discharging period of a display device according to an embodiment.

FIG. 2 illustrates an emission period and a discharging period of a display device according to an embodiment.

In an embodiment, as shown in FIG. 2, the display device may have a discharging period and an emission period within 1 frame period (1 FRAME). A time length of one frame period (1 FRAME) may be changed based on a driving frequency (for example, 12 hertz (Hz), 60 Hz, 120 Hz, etc.) of the display device.

The emission period (EMISSION) is a period during which the quantum dot diode 30 emits light. The display device may display an image by transmitting a data signal corresponding to a gray (or grayscale level) to each pixel during the emission period (EMISSION).

The discharging period (DISCHARGING) is a period for eliminating the charging of non-bound carriers accumulated during the emission period (EMISSION). When an excess charge carrier is injected into the quantum dot diode 30 or when the charging of a specific charge carrier severely occurs, light emission may not occur even when an additional charge carrier is injected into the quantum dot diode 30, so that the efficiency and life-span of the quantum dot diode 30 are substantially affected.

The discharging period (DISCHARGING) has a shorter time length than the emission period (EMISSION). The length of the discharging period (DISCHARGING) may be an entire period excluding the emission period (EMISSION) within 1 frame, or may be a portion of the period, but is not limited thereto.

In an embodiment of a display device driven by a thin film transistor, an on/off signal may be desired to be inputted within an accurate and fast time to display an accurate grayscale of an image. However, if charging severely occurs in an element of the display device, an unintended high current may flow as a delayed input is performed at a signal rising time, which is a point when the element is turned on, or even a previously charged signal is inputted at once. Similarly, even if a signal falling time is delayed at a point of time of off, delayed light emission may occur due to some remaining signal (voltage) due to charging, so that an afterimage may be displayed on a screen such that a fast response speed may be desired. In addition, when charging occurs in the quantum dot diode 30, a trion or bi-exciton due to auger-recombination may occur, so that the efficiency and life-span of the element may be affected.

Accordingly, an embodiment of the display device according to the disclosure may perform an operation to eliminate charging accumulation of non-bound carriers during a period (for example, a non-emission period) between the emission periods (EMISSION). Therefore, in such an embodiment, the emission efficiency (e.g., quantum efficiency or photoluminescent efficiency) and life-span of the emission element, that is, the quantum dot diode 30, is improved.

Hereinafter, embodiments of a display device and a driving method thereof will be described with reference to FIG. 3 to FIG. 5.

Figure 3:
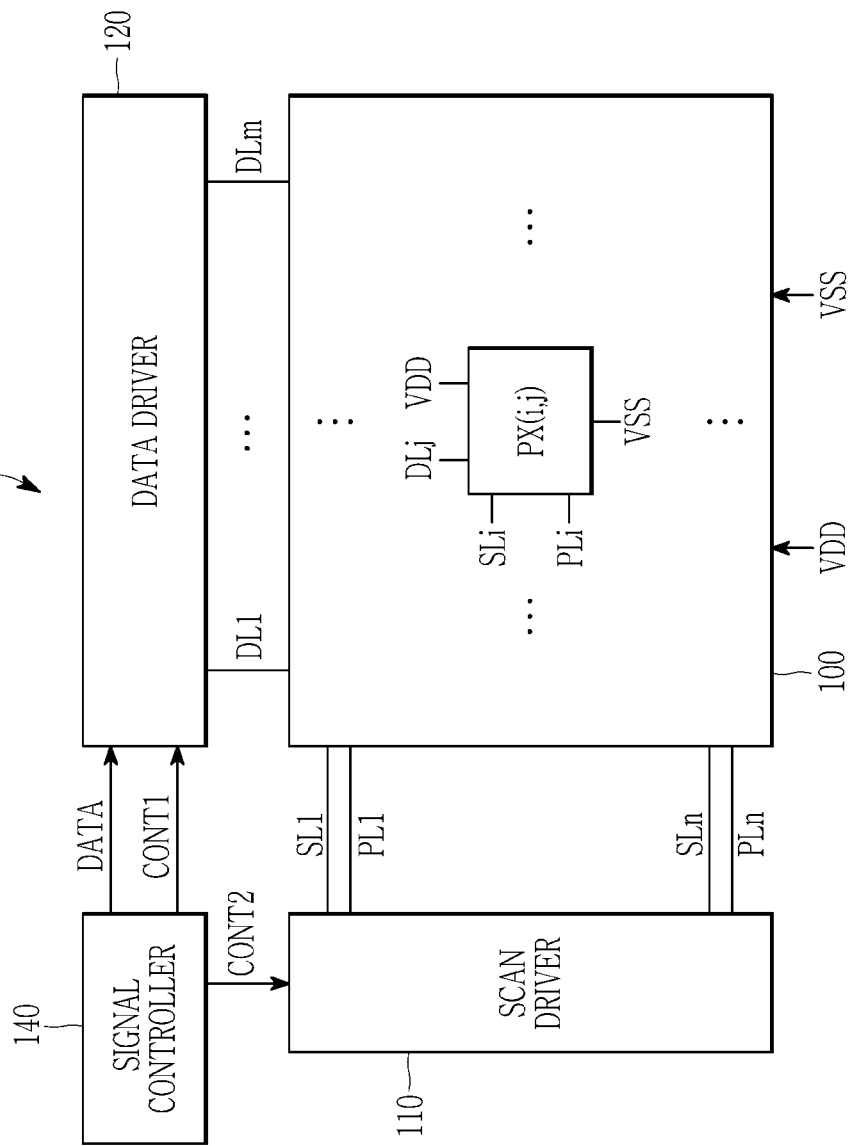
FIG. 3 illustrates a schematic block diagram of a display device according to an embodiment.

FIG. 3 illustrates a schematic block diagram of a display device according to an embodiment.

An embodiment of the display device 10 includes a display part 100, a scan driver 110, a data driver 120, and a signal controller 140. For convenience of illustration and description, FIG. 3 shows some elements of the display device, and the display device may include more or less constituent elements than the constituent elements listed above.

The display part 100 includes a plurality of pixels PX that are connected to a corresponding first scan line among a plurality of first scan lines SL1 to SLn, to a corresponding second scan line among a plurality of second scan lines PL1 to PLn, and to a corresponding data line among a plurality of data lines DL1 to DLm. Here, n and m are natural numbers. Each of the plurality of pixels PX emits light based on a data signal transmitted by a data line corresponding thereto, so that the display part 100 may display an image. Each of the plurality of pixels PX is supplied with power source voltages VDD and VSS.

In an embodiment, the plurality of pixels PX may be arranged in a matrix form with a plurality of rows and a plurality of columns. The plurality of first scan lines SL1 to SLn may extend in a row direction, and are substantially parallel to each other. The plurality of second scan lines PL1 to PLn may extend in a row direction, and are substantially parallel to each other. The plurality of data lines DL1 to DLm may extend in a column direction, and are substantially parallel to each other.

In an embodiment, the first scan lines SL1 to SLn and the second scan lines PL1 to PLn may be wires in a same layer. The first scan lines SL1 to SLn, the second scan lines PL1 to PLn, and the data lines DL1 to DLm may include a same material as or different materials from each other, and may be disposed in a same layer as or different layers from each other on the substrate. Herein, when two layers are disposed in a same layer as each other, the two layers may be disposed directly on a same layer as each other.

The scan driver 110 is connected to the display part 100 through the plurality of first scan lines SL1 to SLn. In an embodiment, the scan driver 110 is connected to the display part 100 through the plurality of second scan lines PL1 to PLn. The scan driver 110 generates a plurality of first scan signals based on a control signal CONT2 to transmit the plurality of first scan signals to the plurality of first scan lines SL1 to SLn, and generates a plurality of second scan signals to transmit the plurality of second scan signals to the plurality of second scan lines PL1 to PLn. The control signal CONT2 is an operation control signal of the scan driver 110 generated and transmitted by the signal controller 140.

The data driver 120 is connected to each pixel PX of the display part 100 through the plurality of data lines DL1 to DLm. The data driver 120 receives an image data signal DATA, and transmits a data signal to a corresponding data line among the plurality of data lines DL1 to DLm based on a control signal CONT1. The control signal CONT1 is an operation control signal of the data driver 120 generated and transmitted by the signal controller 140.

The data driver 120 selects a gray voltage corresponding to the image data signal DATA to transmit the gray voltage as a data signal to the plurality of data lines. In one embodiment, for example, the data driver 120 samples and holds the image data signal DATA inputted based on the control signal CONT1, and transmits a plurality of data signals to the plurality of data lines DL1 to DLm. The data driver 120 may apply a data signal in a predetermined voltage range to the plurality of data lines DL1 to DLm while a first scan signal of an enable level is applied to the pixels PX.

The signal controller 140 receives an image signal IS inputted from the outside and an input control signal that controls a display thereof. The image signal IS may include luminance information distinguished by a gray of each pixel PX of the display part 100.

In an embodiment, the input control signal transmitted to the signal controller 140 may include a data vertical synchronization signal, a horizontal synchronization signal, a main clock signal, and a data enable signal.

In such an embodiment, the signal controller 140 generates the control signals CONT1 and CONT2 and the image data signal DATA based on the image signal IS, the horizontal synchronization signal, the vertical synchronization signal, the main clock signal, the data enable signal.

In an embodiment, the signal controller 140 generates the control signal CONT1 that controls the operation of the data driver 120, and transmits the control signal CONT1 together with the image data signal DATA that is processed by the image processing to the data driver 120. In such an embodiment, the signal controller 140 transmits the control signal CONT2 that controls the operation of the scan driver 110 to the scan driver 110.

The signal controller 140 may perform an image processing on the image signal IS based on the inputted image signal IS and the input control signal, so the image processing may be selected based on the operating conditions of the display part 100 and the data driver 120. The signal controller 140 may generate the image data signal DATA through image processing such as gamma correction and luminance compensation for the image signal IS.

In an embodiment, as described above, the first scan lines SL1 to SLn and the second scan lines PL1 to PLn are connected to the scan driver 110, but not being limited thereto. Alternatively, the second scan lines PL1 to PLn may be connected to a unit, a circuit, or a module other than the scan driver 110.

Hereinafter, a pixel included in the display device according to an embodiment will be described with reference to FIG. 4.

Figure 4:
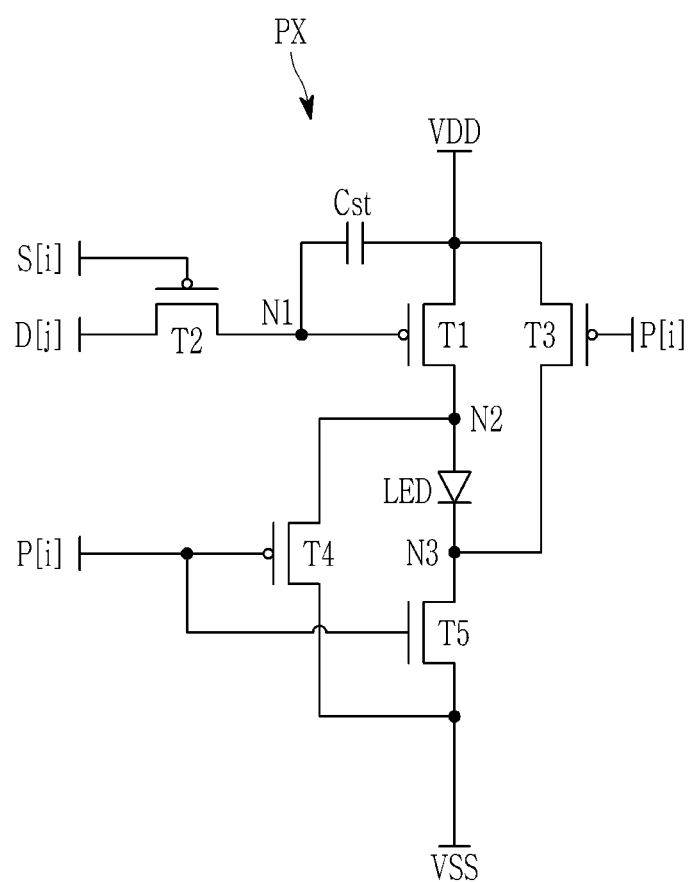
FIG. 4 illustrates a circuit diagram of a pixel of the display device of FIG. 3.

FIG. 4 illustrates a circuit diagram of a pixel of the display device of FIG. 3.

Referring to FIGS. 3 and 4, an embodiment of the pixel PX includes a plurality of transistors T1, T2, T3, T4, T5, T6, and T7, a capacitor (also referred to as a storage capacitor) Cst, and a quantum dot diode LED that are selectively connected to a scan line SLi supplied with a first scan signal S[i], a scan line PLi supplied with a second scan signal P[i], a data line DLj supplied with a data signal D[j], and wires supplied with each of the power source voltages VDD and VSS. Herein, i is a natural number equal to or less than n, and j is a natural number equal to or less than m.

The quantum dot diode LED may be connected between a second node N2 and a third node N3. The quantum dot diode LED may emit light based on a driving current transmitted through the first transistor T1.

The first transistor T1 is connected between the first power source voltage VDD and the second node N2, and includes a gate connected to a first node N1. The second node N2 may correspond to an anode of the quantum dot diode LED. The first transistor T1 may transmit a driving current to the quantum dot diode LED in response to a voltage of the first node N1.

The second transistor T2 is connected between the data line DLj and the first node N1, and includes a gate connected to the corresponding first scan line SLi. The second transistor T2 may provide the data voltage D[j] applied to the data line DLj to the first node N1 in response to the scan signal S[i] transmitted through the first scan line SLi.

The storage capacitor Cst is connected between the first power source voltage VDD and the first node N1. The storage capacitor Cst may store a voltage provided through the second transistor T2.

The third transistor T3 is connected between the first power source voltage VDD and the third node N3, and may include a gate connected to the corresponding second scan line PLi. The third transistor T3 may apply the first power source voltage VDD to the third node N3 in response to the second scan signal P[i] transmitted through the second scan line PLi. The third node N3 may correspond to a cathode of the quantum dot diode LED.

The fourth transistor T4 is connected between the second node N2 and the second power source voltage VSS, and may include a gate connected to the second scan line PLi. The fourth transistor T4 may apply the second power source voltage VSS to the second node N2 in response to the second scan signal P[i] transmitted through the second scan line PLi.

The fifth transistor T5 is connected between the third node N3 and the second power source voltage VSS, and may include a gate connected to the second scan line PLi. The fifth transistor T5 may connect the third node N3 to the second power source voltage VSS in response to the second scan signal P[i] transmitted through the second scan line PLi. Here, the fifth transistor T5 may complementarily operate with the fourth transistor T4. In one embodiment, for example, the gates of the fourth transistor T4 and the fifth transistor T5 are connected to a same second scan line PLi, the fifth transistor T5 may be an N-type thin film transistor, and the fourth transistor T4 may be a P-type thin film transistor.

Hereinafter, an embodiment of a driving method of the display device in the emission period (EMISSION) and the discharging period (DISCHARGING) will be described with reference to FIG. 5.

Figure 5:
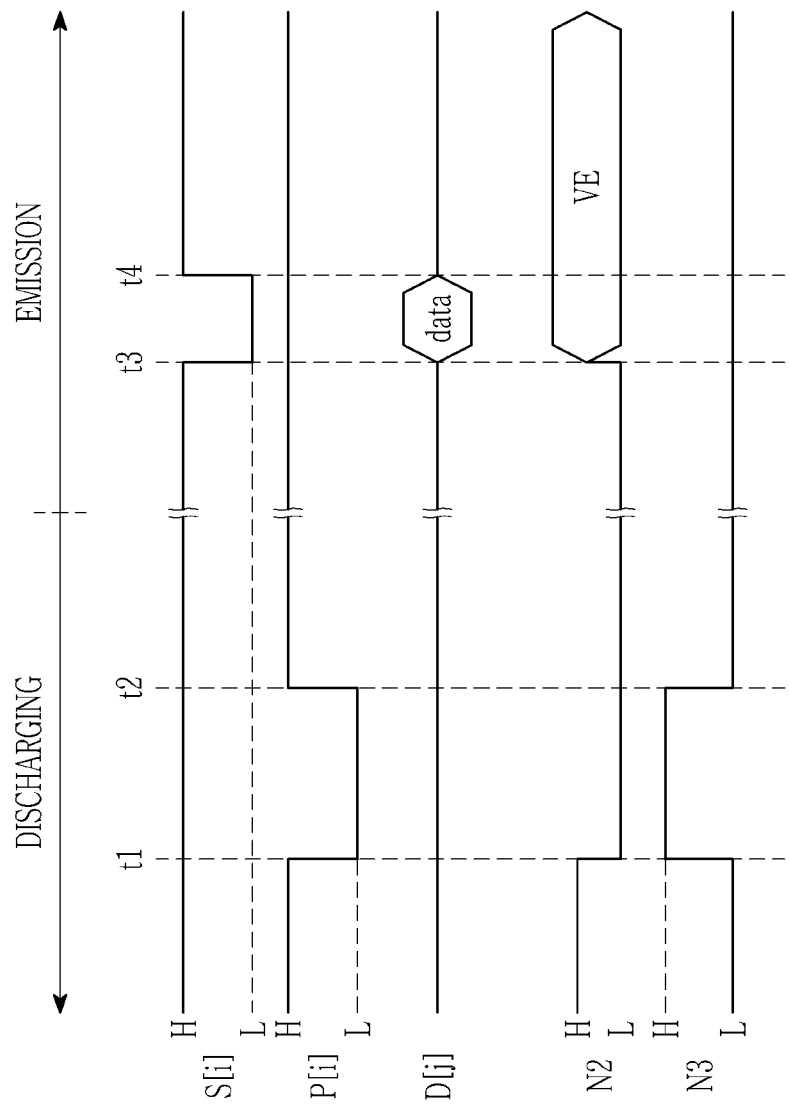
FIG. 5 illustrates a timing diagram of driving timing of the display device of FIG. 3.

FIG. 5 illustrates a timing diagram of driving timing of the display device of FIG. 3.

Hereinafter, signals applied to the first scan line SLi, the second scan line PLi, and the data line DLj connected to the pixel PX(i,j) will be described in detail.

As shown in FIG. 5, a pixel discharging operation may be performed during the period (DISCHARGING) excluding a period in which an image is displayed within one frame period (for example, a vertical blank period).

At a first time point t1 in one frame period, the second scan signal P[i] may be changed to an enable level L. At the first time point t1, the first scan signal S[i] has a disable level H.

Thus, the third transistor T3 and the fourth transistor T4 are turned on, and the second transistor T2 and fifth transistor T5 are turned off.

Accordingly, during a period from the first time point t1 to a second time point t2, the second power source voltage VSS is applied to the second node N2, and the first power source voltage VDD is applied to the third node N3. That is, the second power source voltage VSS is applied to the anode of the quantum dot diode 30, and the first power source voltage VDD is applied to the cathode thereof. Thus, in such an embodiment, the non-bound charge carrier may be discharged.

Next, during the emission period (EMISSION), the first scan signal S[i] may be changed to the enable level L at a third time point t3. During the emission period (EMISSION), the second scan signal P[i] has the disable level H.

In addition, a corresponding data signal (data) is applied to the data line D[j] during a period from the third time point t3 to a fourth time point t4.

Thus, a driving current flows through the first transistor T1, so that the quantum dot diode 30 emits light.

In such an embodiment, as described above, during the non-emission period, by applying opposite voltages to the anode and cathode of the quantum dot diode 30, respectively, the non-bound charge carrier may be discharged. Accordingly, the interface charging of the emission layer including the quantum dot and the electron transporting layer is eliminated, thereby reducing degradation and increasing a life-span.

Hereinafter, alternative embodiments of a display device and a driving method thereof according to another embodiment will be described in detail with reference to FIG. 6 to FIG. 8.

Figure 6:
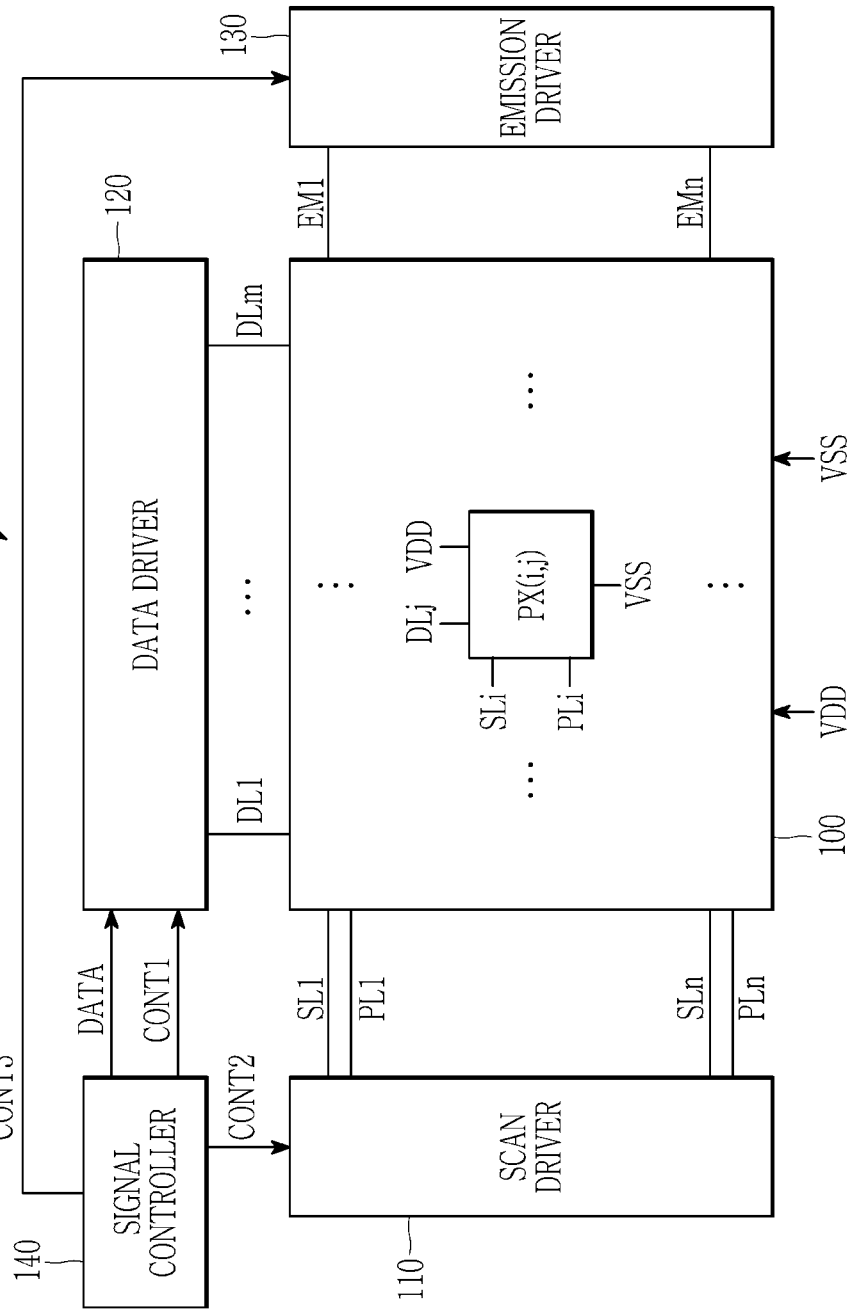
FIG. 6 illustrates a schematic block diagram of a display device according to an alternative embodiment.

FIG. 6 illustrates a schematic block diagram of a display device according to an alternative embodiment.

The block diagram in FIG. 6 is substantially the same as the block diagram shown in FIG. 3 except that the display device 10 of FIG. 6 further includes an emission driver 130. The same or like elements shown in FIG. 6 have been labeled with the same reference characters as used above to describe the embodiment of the display device shown in FIG. 3, and any repetitive detailed description thereof will hereinafter be omitted or simplified.

The display part 100 includes a plurality of pixels PX that are connected to a corresponding first scan line among a plurality of first scan lines SL1 to SLn, to a corresponding second scan line among a plurality of second scan lines PL1 to PLn, to a corresponding emission control line among a plurality of emission control lines EM1 to EMn, and to a corresponding data line among a plurality of data lines DL1 to DLm. Each of the plurality of pixels PX emits light corresponding to a data signal transmitted by a data line corresponding thereto, so that the display part 100 may display an image.

In such an embodiment, the plurality of emission control lines EM1 to EMn may extend in the row direction, and are substantially parallel to each other.

In such an embodiment, the first scan lines SL1 to SLn, the second scan line PL1 to PLn, and the emission control lines EM1 to EMn may be wires in a same layer as each other. The first scan lines SL1 to SLn, the second scan lines PL1 to PLn, the emission control lines EM1 to EMn, and the data lines DL1 to DLm may include a same material as or different materials from each other, and may be disposed in a same layer as or different layers from each other on the substrate.

The emission driver 130 generates a plurality of emission control signals based on a control signal CONT3. The control signal CONT3 may include an emission start signal, emission clock signals switched to a low level at different timings from each other, a holding control signal, and the like. The emission start signal is a signal for generating a first emission control signal for displaying an image of one frame. The emission clock signals included in the control signal CONT3 are synchronization signals for applying an emission control signal to the plurality of emission control lines EM1 to EMn. The holding control signal is a signal for controlling the emission driver 130 so that the emission driver 130 continuously outputs the emission signal during low frequency driving.

While the first scan signal and the second scan signal of the enable level are applied to the pixels PX based on the control signal CONT1, the data driver 120 may apply a data signal to the plurality of data lines DL1 to DLm so that a voltage level is changed at least once.

Hereinafter, a pixel included in the display device according to an alternative embodiment will be described with reference to FIG. 7.

Figure 7:
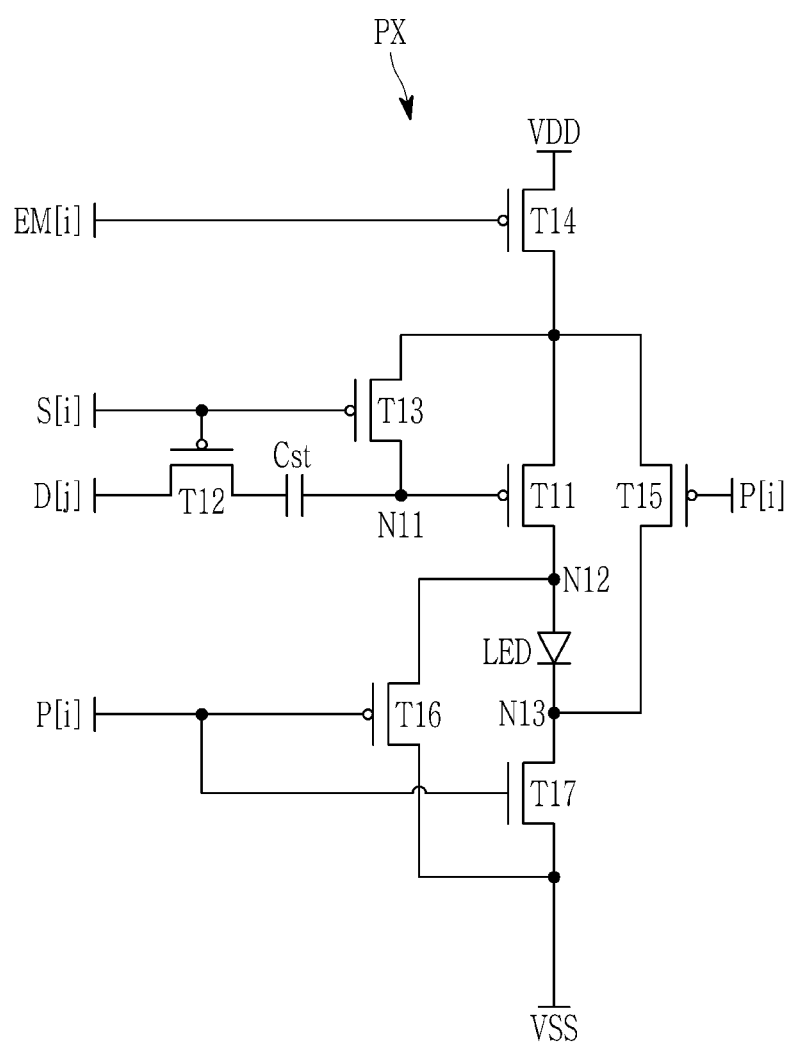
FIG. 7 illustrates a circuit diagram of a pixel of the display device of FIG. 6.

FIG. 7 illustrates a circuit diagram of a pixel of the display device of FIG. 6.

The pixel PX includes a plurality of transistors T11, T12, T13, T14, T15, T16, and T17, a capacitor Cst, and a quantum dot diode LED that are selectively connected to a scan line SLi supplied with a first scan signal S[i], a scan line PLi supplied with a second scan signal P[i], an emission control line EMi supplied with an emission control signal EM[i], a wire supplied with an initialization voltage Vint, a data line DLj supplied with a data signal D[j], and wires supplied with the power source voltages VDD and VSS.

The quantum dot diode LED may be connected between a second node N12 and a third node N13. The quantum dot diode LED may emit light based on a driving current transmitted through the first transistor T11.

The first transistor T11 is connected between the first power source voltage VDD and the second node N12, and includes a gate connected to a first node N11. The second node N12 may correspond to an anode of the quantum dot diode LED. The first transistor T11 may transmit a driving current to the quantum dot diode LED in response to a voltage of the first node N11.

The second transistor T12 is connected between the data line DLj and the first node N11, and includes a gate connected to the corresponding first scan line SLi. The second transistor T12 may provide the data voltage D[j] applied to the data line DLj to the first node N11 through the storage capacitor Cst in response to the scan signal S[i] transmitted to the first scan line SLi.

The storage capacitor Cst is connected between the second transistor T12 and the first node N11. The storage capacitor Cst may store a voltage provided through the second transistor T12.

The third transistor T13 is connected between one end of the first transistor T11 and the first node N11, and includes a gate connected to the corresponding first scan line SLi.

The fourth transistor T14 is connected between the first power source voltage VDD and one end of the first transistor T11, and includes a gate connected to the emission control line EMi.

The fifth transistor T15 is connected between one end of the first transistor T11 and the third node N13, and may include a gate connected to the corresponding second scan line PLi. The fifth transistor T15 may apply the first power source voltage VDD to the third node N13 in response to the second scan signal P[i] transmitted through the second scan line PLi. The third node N13 may correspond to a cathode of the quantum dot diode LED.

The sixth transistor T16 is connected between the second node N12 and the third node N13, and may include a gate connected to the second scan line PLi. The sixth transistor T16 may apply the second power source voltage VSS to the second node N12 in response to the second scan signal P[i] transmitted through the second scan line PLi.

The seventh transistor T17 is connected between the third node N13 and the second power source voltage VSS, and may include a gate connected to the second scan line PLi. The seventh transistor T17 may connect the third node N13 to the second power source voltage VSS in response to the second scan signal P[i] transmitted through the second scan line PLi. Here, the seventh transistor T17 may complementarily operate with the sixth transistor T16. In one embodiment, for example, the gates of the sixth transistor T16 and the seventh transistor T17 are connected to a same second scan line PLi, the seventh transistor T17 may be an N-type thin film transistor, and the sixth transistor T16 may be a P-type thin film transistor.

Hereinafter, an embodiment of a driving method of the display device in the emission period (EMISSION) and the discharging period (DISCHARGING) will be described with reference to FIG. 8.

Figure 8:
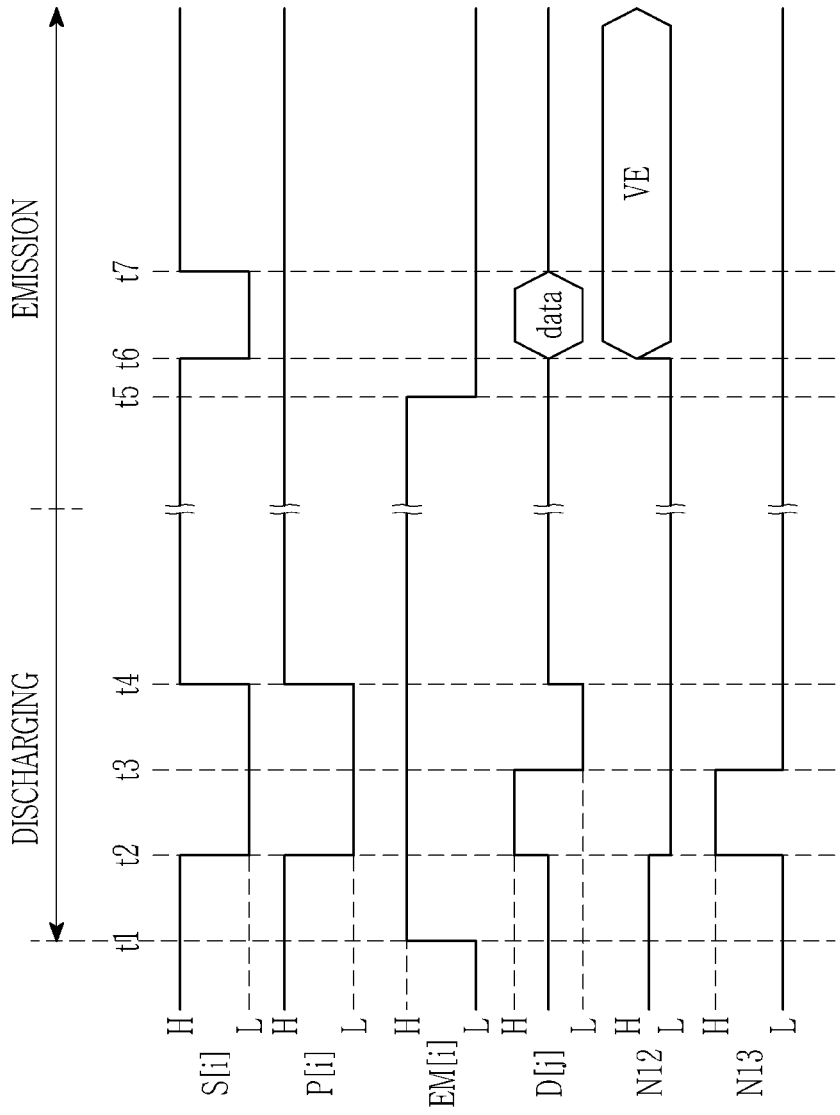
FIG. 8 illustrates a timing diagram of driving timing of the display device of FIG. 6.

FIG. 8 illustrates a timing diagram of driving timing of the display device of FIG. 6.

Hereinafter, signals applied to the first scan line SLi, the second scan line PLi, the emission control line EMi, and the data line DLj connected to the pixel PX(i,j) will be described in detail.

In an embodiment, as shown in FIG. 8, a pixel discharging operation may be performed during the period (DISCHARGING) excluding a period in which an image is displayed within one frame period (for example, a vertical blank period).

At a first time point t1, the emission control signal EM[i] may be changed to the disable level H. At the first time point t1, the first scan signal S[i] and the second scan signal P[i] have the disable level H.

At a second time point t2, the first scan signal S[i] and the second scan signal P[i] may be changed to the enable level L. The first scan signal S[i] and the second scan signal P[i] having the enable level L may be applied during a period from the second time point t2 to a fourth time point t4. The high level voltage H is applied to the data line DL[j] during a period from the second time point t2 to a third time point t3.

Thus, the second transistor T12, the third transistor T13, the fifth transistor T15, and the sixth transistor T16 are turned on, and the seventh transistor T17 is turned off.

The second power source voltage VSS is applied to the second node N12, and the high level voltage H is transmitted to the third node N13 by coupling of the storage capacitor Cst. That is, the second power source voltage VSS is applied to the anode of the quantum dot diode 30, and the high level voltage is applied to the cathode thereof. By applying a reverse voltage to the quantum dot diode 30, the non-bound charge carrier may be discharged.

At the third time point t3, the low level voltage L is applied to the data line DL[j]. Thus, the low level voltage L is transmitted to the third node N13 by the coupling of the storage capacitor Cst.

During the emission period (EMISSION), at a fifth time point t5, the emission control signal EM[i] may be changed to the enable level L, and at a sixth time point t6, the first scan signal S[i] may be changed to the enable level L. During a period form the fifth time point t5 to the sixth time point t6, the second scan signal P[i] has the disable level H. In addition, a corresponding data signal (data) is applied to the data line D[j] during a period from the sixth time point t6 to a seventh time point t7.

Thus, a driving current flows through the first transistor T1, so that the quantum dot diode 30 emits light.

In such an embodiment, as described above, during the non-emission period, by applying a reverse voltage to the anode and cathode of the quantum dot diode 30, the non-bound charge carrier may be discharged. Accordingly, the interface charging of the emission layer including the quantum dot and the electron transporting layer is eliminated, thereby reducing degradation and increasing a life-span.

Hereinafter, a measurement result when the light emitting element and the display device including the light emitting element according to an embodiment of the disclosure are driven will be described in detail with reference to FIG. 9 to FIG. 11.

Figure 9:
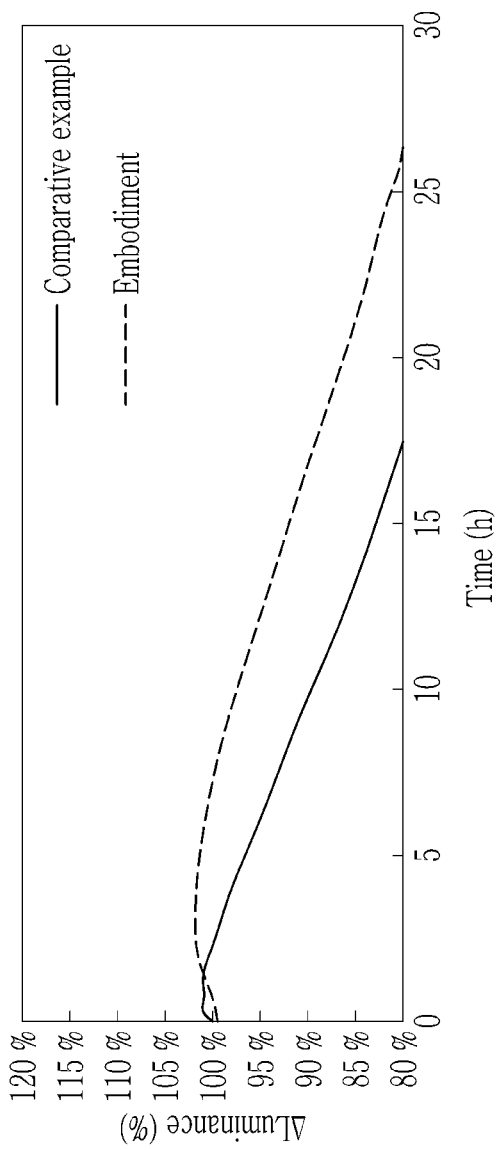
FIG. 9 illustrates a graph of results of measuring a luminance variation ratio to a time of display devices according to an embodiment and a comparative example.

FIG. 9 illustrates a graph of results of measuring a luminance variation ratio to a time of display devices according to an embodiment and a comparative example.

A comparative example is a case in which a frequency of 1 frame is 60 Hz and the blue quantum dot diode 30 is driven with a constant brightness (650 nit).

An embodiment is a case in which when a frequency of 1 frame is 60 Hz and the blue quantum dot diode 30 is driven with a constant brightness (650 nit), where about −5 volts (V) is applied to the anode of the quantum dot diode 30 and about 2.7 V is applied to the cathode thereof during the discharging period (DISCHARGING).

According to the luminance change rate (ΔLuminance) (%) over time, it can be seen that the luminance change does not occur for a longer time in the display device according to the embodiment compared with the display device according to the comparative example.

Figure 10:
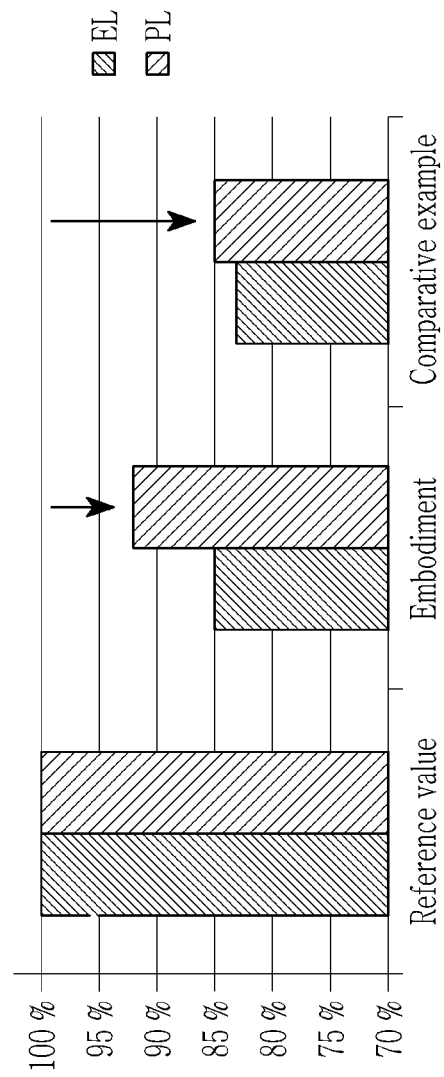
FIG. 10 illustrates a graph of results of measuring PL reduction of a quantum dot diode of a display device according to an embodiment and a comparative example.

FIG. 10 illustrates a graph of results of measuring a PL reduction of a quantum dot diode of a display device according to an embodiment and a comparative example.

In FIG. 10, reference values are EL luminance values and PL luminance values that are initially measured. Table 1 shows how much the EL luminance values and the PL luminance values of the embodiment and the comparative example were reduced compared with the reference value.

TABLE 1

|    | Embodiment  | Comparative example |
|----|-------------|---------------------|
| EL | 85% (↓15%)  | 83% (↓17%)          |
| PL | 92% (↓8%)   | 85% (↓15%)          |

As shown in Table 1 and FIG. 10, it can be seen that the decrease in the PL luminance value of the display device of the embodiment is less that of the Comparative example. That is, the emission efficiency of the quantum dot diode 30 of the embodiment is different from that of the quantum dot diode 30 of the comparative example by the voltage applied to two electrodes of the quantum dot diode 30 during the discharging period (DISCHARGING).

After applying a reverse voltage to the two electrodes of the quantum dot diode 30 according to the embodiment, the PL luminance value is measured by turning off the pixel (non-emission state), and after applying a constant voltage to the two electrodes of the quantum dot diode 30 according to the comparative example, the PL luminance value is measured by turning off the pixel (non-emission state), and it can be seen that the PL luminance value of the pixel in the embodiment is higher than that of the pixel in the comparative example.

Figure 11:
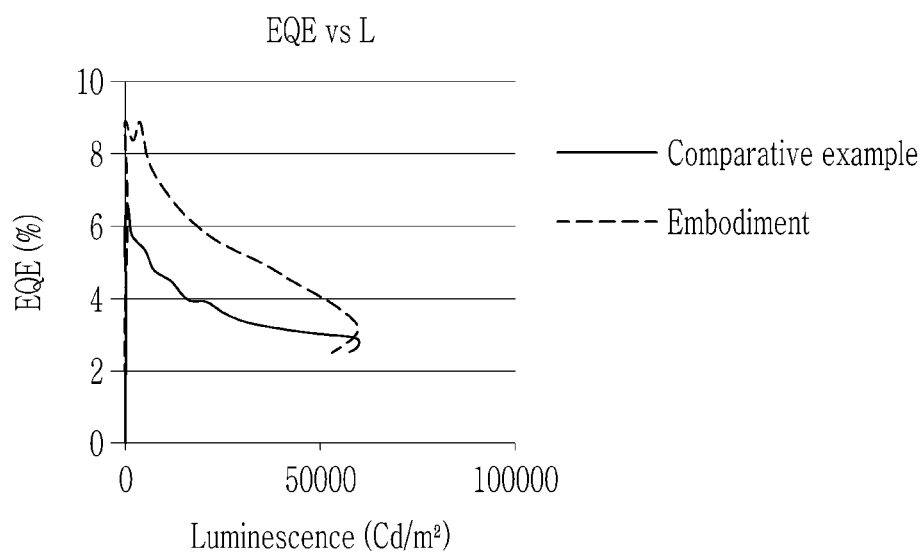
FIG. 11 illustrates a graph of results of measuring external quantum efficiency to luminance of display devices according to an embodiment and a comparative example after electrical annealing.

FIG. 11 illustrates a graph of results of measuring external quantum efficiency to luminance of display devices according to an example and a comparative example after electrical annealing.

TABLE 2

|                    | Embodiment | Comparative example |
|--------------------|------------|---------------------|
| EQE max %)[1]      | 9.4        | 6.8                 |
| EQE (@5000 nt)     | 8.9        | 5.6                 |
| EQE (@10000 nt)    | 7.7        | 4.7                 |

[1]EQE max (%): Referring to the maximum external quantum efficiency

Table 2 and FIG. 11, it can be seen that the emission efficiency of the manufactured display device according to the embodiment is improved from about 6.8% to about 9.4% compared to that of the manufactured display device according to the comparative example.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting element comprising:
   a first electrode;
   a second electrode; and
   a light emission layer interposed between the first electrode and the second electrode,
   wherein an emission efficiency of the light emission layer varies based on a voltage applied to at least one selected from the first electrode and the second electrode,
   wherein a voltage applied to the first electrode in an emission period of one frame, during which the light emission layer emits light, is higher than a voltage applied to the second electrode in the emission period of the one frame, and
   wherein a voltage applied to the second electrode in a non-emission period of the one frame, during which the light emission layer does not emit light, is higher than a voltage applied to the first electrode in the non-emission period of the one frame.

2. The light emitting element of claim 1, wherein the emission period in the one frame is longer than the non-emission period in the one frame.

3. The light emitting element of claim 1, wherein the emission efficiency of the light emission layer increases during the non-emission period in the one frame.

4. The light emitting element of claim 1, wherein the light emission layer includes a quantum dot layer.

5. The light emitting element of claim 4, wherein the quantum dot layer includes a quantum dot phosphor material or a phosphorescent material.

6. The light emitting element of claim 4, wherein the quantum dot layer is provided in plural.

7. A display device comprising
   a plurality of pixels,
   wherein each of the plurality of pixels includes:
      a light emission diode;
      a first transistor connected between an anode of the light emission diode and a first power source voltage line;
      a second transistor which transmits a data signal to a gate of the first transistor in response to a first scan signal;
      a capacitor connected to the gate of the first transistor, wherein the capacitor stores a voltage corresponding to the data signal;
      a third transistor connected between one end of the first transistor and a cathode of the light emission diode;
      a fourth transistor connected between the anode of the light emission diode and a second power source voltage line; and a fifth transistor which complementarily operates with the fourth transistor and is connected between the cathode of the light emission diode and the second power source voltage line, and wherein an emission efficiency of the light emission diode varies based on a voltage applied to at least one selected from the anode and the cathode.

8. The display device of claim 7, wherein
the fifth transistor is turned on in an emission period, during which the light emission diode emits light, and
the third transistor and the fourth transistor are turned off in the emission period.

9. The display device of claim 8, wherein
the fifth transistor is turned off in a non-emission period, during which the light emission diode does not emit light, and
the third transistor and the fourth transistor are turned on in the non-emission period.

10. The display device of claim 9, wherein
a voltage applied to the anode during the emission period is higher than a voltage applied to the cathode during the emission period.

11. The display device of claim 10, wherein
a voltage applied to the cathode during the non-emission period is higher than that applied to the anode during the non-emission period.

12. The display device of claim 9, wherein
the emission period in one frame is longer than the non-emission period in the one frame.

13. The display device of claim 9, wherein
an emission efficiency of a light emission layer of the light emission diode interposed between the anode and the cathode increases in the non-emission period.

14. The display device of claim 13, wherein
the light emission layer includes a quantum dot layer.

15. The display device of claim 14, wherein
the quantum dot layer includes a quantum dot phosphor material or a phosphorescent material.

16. The display device of claim 7, wherein
the capacitor includes one electrode connected to the gate of the first transistor and another electrode connected to the first power source voltage line.

17. The display device of claim 7, wherein
each of the plurality of pixels further includes:
a sixth transistor which is turned on during an emission period, during which the light emission diode emits light, and is connected between one end of the first transistor and the first power source voltage line; and
a seventh transistor which is turned on by the first scan signal and is connected between one end of the first transistor and the gate of the first transistor.

18. The display device of claim 17, wherein
a level of the data signal is changed at least once during a non-emission period, during which the light emission diode does not emit light.

19. A light emitting element of a display device, the lighting emitting element comprising:
a first electrode;
a second electrode; and
a light emission layer interposed between the first electrode and the second electrode,
wherein a forward voltage is applied to the light emission layer during an emission period in one frame, during which the light emission layer emits light, and a reverse voltage is applied to the light emission layer during a non-emission period in the one frame, during which the light emission layer does not emit light.

* * * * *